(12) United States Patent
Huang et al.

(10) Patent No.: US 7,847,365 B2
(45) Date of Patent: Dec. 7, 2010

(54) MOSFET WITH ISOLATION STRUCTURE FOR MONOLITHIC INTEGRATION AND FABRICATION METHOD THEREOF

(75) Inventors: Chih-Feng Huang, Jhubei (TW); Tuo-Hsin Chien, Tucheng (TW); Jenn-Yu Lin, Sindian (TW); Ta-yung Yang, Milpitas, CA (US)

(73) Assignee: System General Corp., Taipei Hsien (TW)

( * ) Notice: Subject to any disclaimer, the term of this patent is extended or adjusted under 35 U.S.C. 154(b) by 463 days.

(21) Appl. No.: 11/913,037

(22) PCT Filed: Oct. 14, 2005

(86) PCT No.: PCT/CN2005/001686

§ 371 (c)(1),
(2), (4) Date: May 12, 2008

(87) PCT Pub. No.: WO2006/114029

PCT Pub. Date: Nov. 2, 2006

(65) Prior Publication Data

US 2009/0050962 A1    Feb. 26, 2009

(30) Foreign Application Priority Data

Apr. 28, 2005    (CN) .................. 2005 1 0066874

(51) Int. Cl.
*H01L 29/78*    (2006.01)
(52) U.S. Cl. .................. 257/500; 257/297; 438/297
(58) Field of Classification Search .......... 257/E21.532, 257/344, 297, E29.266, E21.437; 438/106, 438/109, 110, 118, 125
See application file for complete search history.

(56) References Cited

U.S. PATENT DOCUMENTS

| | | | |
|---|---|---|---|
| 4,928,159 A * | 5/1990 | Mihara et al. | 257/370 |
| 5,602,416 A | 2/1997 | Zambrano | 257/500 |
| 2004/0169236 A1 | 9/2004 | Sridhar et al. | 257/371 |
| 2006/0220170 A1* | 10/2006 | Huang et al. | 257/500 |
| 2008/0116513 A1* | 5/2008 | Williams et al. | 257/338 |
| 2008/0210980 A1* | 9/2008 | Disney et al. | 257/204 |

FOREIGN PATENT DOCUMENTS

| CN | 1155764 | 7/1997 |
|---|---|---|
| EP | 0 871 215 | 10/1998 |

\* cited by examiner

*Primary Examiner*—Roy K Potter
(74) *Attorney, Agent, or Firm*—J.C. Patents

(57) ABSTRACT

A MOSFET device with an isolation structure for a monolithic integration is provided. A P-type MOSFET includes a first N-well disposed in a P-type substrate, a first P-type region disposed in the first N-well, a P+ drain region disposed in the first P-type region, a first source electrode formed with a P+ source region and an N+ contact region. The first N-well surrounds the P+ source region and the N+ contact region. An N-type MOSFET includes a second N-well disposed in a P-type substrate, a second P-type region disposed in the second N-well, an N+ drain region disposed in the second N-well, a second source electrode formed with an N+ source region and a P+ contact region. The second P-type region surrounds the N+ source region and the P+ contact region. A plurality of separated P-type regions is disposed in the P-type substrate to provide isolation for transistors.

12 Claims, 6 Drawing Sheets

MOSFET WITH ISOLATION STRUCTURE FOR MONOLITHIC INTEGRATION AND FABRICATION METHOD THEREOF

CROSS-REFERENCE TO RELATED APPLICATION

This application claims the priority benefit of PCT application serial no.: PCT/CN2005/001686, filed Oct. 14, 2005 which claims PRC application serial no.: 200510066874.8 filed Apr. 28, 2005. The entirety of each of the above-mentioned patent applications is hereby incorporated by reference herein and made a part of this specification.

BACKGROUND OF THE INVENTION

1. Field of the Invention

The present invention relates to a Metal Oxide Semiconductor Field Effect Transistor (MOSFET) with an isolation structure and a fabrication method thereof. More particularly, the present invention relates to a MOSFET with an isolation structure applicable to monolithic integration.

2. Description of Related Art

The integrated control circuit and driver transistor techniques have become the development trends of current power ICs. Therefore, it is a better solution for monolithic IC integration to use a standard manufacturing process to fabricate high voltage transistor devices. However, transistors fabricated by using the current standard manufacturing process are non-isolation structures, and a non-isolated transistor current could flow around the substrate. This may generate interference in the control circuit. Moreover, this transistor current can generate a ground bounce to disturb the control signals of the control circuit. Therefore, transistors of non-isolation structures are not suitable for the integration technique. Conventionally, transistors with an isolation structure and a high breakdown voltage usually employ a thin epitaxial layer and a buried layer, but the complicated manufacturing process leads to a high cost and low yield.

Referring to FIGS. 1 and 2, schematic circuit diagrams of an N-type and a P-type MOSFET are shown. As shown in the figures, the N-type MOSFET (NMOS) 10 includes a drain 20, a source 30, and a gate 40. The P-type MOSFET (PMOS) 50 includes a drain 60, a source 70, and a gate 80.

Referring to FIG. 3, a structural cross-sectional view of a conventional high voltage MOSFET is shown. As shown in the figure, an N-type MOSFET 10 and a P-type MOSFET 50 include a P-type substrate 100, an N+ buried layer 860 and a P+ buried layer 880 formed in the P-type substrate 100, a first N-type epitaxial layer 680 and a second N-type epitaxial layer 660 respectively formed on the P+ buried layer 880 and the N+ buried layer 860.

Furthermore, the conventional high voltage transistor isolation structure uses the first N-type epitaxial layer 680 to surround a first source region 440, a first contact region 450, and a first P-type region 420 of the P-type FET 50, and uses a second N-type epitaxial layer 660 to surround a second drain region 230 and a second P-type region 220 of the N-type FET 10. Meanwhile, a plurality of separated P+ regions 500 having the P+ ions is formed between the first N-type epitaxial layer 680 and the second N-type epitaxial layer 660, so as to provide isolation between the MOSFETs. However, the isolation structures formed by the above conventional method have drawbacks of a complicated manufacturing process, low yield, and even a high fabrication cost.

SUMMARY OF THE INVENTION

The present invention is directed to a MOSFET device with an isolation structure that realizes a higher breakdown voltage and low on-resistance, so as to achieve the purpose of monolithic IC integration. Instead of additional using masks to fabricate an epitaxial layer according to the conventional manufacturing process, the present invention only use a standard well structure to achieve the low cost, high yield, and isolated transistor structure. In order to solve the above technical problems, according to an embodiment of the present invention, a MOSFET with an isolation structure applicable to monolithic integration is provided. The MOSFET includes a P-type MOSFET and an N-type MOSFET which are disposed in a P-type substrate.

The P-type MOSFET includes a first N-type diffusion region having N conductivity-type ions, forming a first N-well in the P-type substrate; a first P-type diffusion region having P conductivity-type ions, forming a first P-type region in the first N-well; a first drain diffusion region having P+ conductivity-type ions, forming a first drain region in the first P-type region; a first source diffusion region having the P+ conductivity-type ions, forming a first source region; and a first contact diffusion region having N+ conductivity-type ions, forming a first contact region. The first N-type diffusion region surrounds the first source region and the first contact region.

Moreover, a plurality of separated P-type diffusion regions having P conductivity-type ions forms a plurality of separated P-type regions in the P-type substrate to provide an isolation effect. A first thin gate oxide layer and a first thick field oxide layer are formed on the P-type substrate. A first gate is disposed on the first thin gate oxide layer, for controlling an amount of current in a first channel. A silicon oxide insulating layer covers the first gate and the first thick field oxide layer. A first drain metal contact having a first metal electrode is connected with the first drain diffusion region. A first source metal contact having a second metal electrode is connected to the first contact diffusion region and the first source diffusion region.

According to the P-type MOSFET of the present invention, the first P-type region located in the first N-well is formed through a P-well manufacturing process.

According to the P-type MOSFET of the present invention, the first P-type region located in the first N-well is formed through a P-type body/base manufacturing process.

The N-type MOSFET includes a second N-type diffusion region having N conductivity-type ions, forming a second N-well in the P-type substrate; a second P-type diffusion region having P conductivity-type ions, forming a second P-type region in the second N-well; a second drain diffusion region having N+ conductivity-type ions, forming a second drain region is formed in the second N-type diffusion region; a second source diffusion region having the N+ conductivity-type ions, forming a second source region; and a second contact diffusion region having P+ conductivity-type ions, forming a second contact region. The second P-type diffusion region surrounds the second source region and the second contact region.

Moreover, a plurality of separated P-type diffusion regions having the P conductivity-type ions forms a plurality of separated P-type regions in the P-type substrate to provide isolation between FETs. The first P-type region located in the first N-type diffusion region, the second P-type region located in the second N-type diffusion region, the plurality of separated P-type regions, the first N-well, and the second N-well form depletion regions in regions of different polarities.

Besides, a first channel is formed between the first source region and the first drain region. A second channel is formed between the second source region and the second drain region. A first gate is located on a first thin gate oxide layer, for controlling an amount of current in the first channel. A second gate is located on a second thin gate oxide layer, for controlling an amount of current in the second channel.

According to the N-type MOSFET of the present invention, the second P-type region located in the second N-well is formed through a P-well manufacturing process.

According to the N-type MOSFET of the present invention, the second P-type region located in the second N-well is formed through a P-type body/base manufacturing process.

Furthermore, since the first N-well and the second N-well respectively formed by the first N-type diffusion region and the second N-type diffusion region provide a low resistance path, for limiting the transistor current between the drain region and the source region.

In order to solve the above technical problems, according to another embodiment of the present invention, a method of fabricating the MOSFET with an isolation structure applicable to the monolithic integration is provided. The method of fabricating the P-type MOSFET is described as follows. First, a P-type substrate is formed. Then, a first N-well is formed in the P-type substrate in a first N-type diffusion region having N conductivity-type ions. Next, a first P-type region is formed in the first N-well in a first P-type diffusion region having P conductivity-type ions. After that, a first drain region is formed in the first P-type diffusion region in a first drain diffusion region having P+ conductivity-type ions. Thereafter, a first source region is formed in a first source diffusion region having the P+ conductivity-type ions, wherein a first channel is formed between the first source region and the first drain region. After that, a first contact region is formed in a first contact diffusion region having N+ conductivity-type ions, wherein the first N-type diffusion region surrounds the first source region and the first contact region.

Next, a plurality of separated P-type regions is formed in the P-type substrate in a plurality of separated P-type diffusion regions having the P conductivity-type ions, so as to provide an isolation effect. After that, a first thin gate oxide layer and a first thick field oxide layer are formed on the P-type substrate. Then, a first gate is disposed on the first thin gate oxide layer, for controlling an amount of current in the first channel. Thereafter, the first gate and the first thick field oxide layer are covered with a silicon oxide insulating layer. After that, a first drain metal contact having a first metal electrode connected with the first drain diffusion region is formed. Finally, a first source metal contact having a second metal electrode connected to the first contact diffusion region and the first source diffusion region is formed.

According to the method of fabricating the P-type MOSFET of the present invention, the first P-type region located in the first N-well is formed through a P-well manufacturing process.

According to the method of fabricating the P-type MOSFET of the present invention, the first P-type region located in the first N-well is formed through a P-type body/base manufacturing process.

Furthermore, a method of fabricating the N-type MOSFET is described as follows. First, a P-type substrate is formed. Then, a second N-well is formed in the P-type substrate in a second N-type diffusion region having N conductivity-type ions. Next, a second P-type region is formed in the second N-well in a second P-type diffusion region having P conductivity-type ions. After that, a second drain region is formed in the second N-type diffusion region in a second drain diffusion region having N+ conductivity-type ions. Thereafter, a second source region is formed in a second source diffusion region having the N+ conductivity-type ions, wherein a second channel is formed between the second source region and the second drain region. After that, a second contact region is formed in a second contact diffusion region having P+ conductivity-type ions, wherein the second P-type region surrounds the second source region and the second contact region.

Next, a plurality of separated P-type regions is formed in the P-type substrate in a plurality of separated P-type diffusion regions having P conductivity-type ions, so as to provide an isolation effect. After that, a second thin gate oxide layer and a second thick field oxide layer are formed on the P-type substrate. Then, a second gate is disposed on the second thin gate oxide layer, for controlling an amount of current in the second channel. Thereafter, the second gate and the second thick field oxide layer are covered with a silicon oxide insulating layer. After that, a second drain metal contact having a third metal electrode connected with the second drain diffusion region is formed. Finally, a second source metal contact having a fourth metal electrode connected to the second contact diffusion region and the second source diffusion region is formed.

According to the method of fabricating the N-type MOSFET of the present invention, the second P-type region located in the second N-well is formed through a P-well manufacturing process.

According to the method of fabricating the N-type MOSFET of the present invention, the second P-type region located in the second N-well is formed through a P-type body/base manufacturing process.

Instead of additional using masks to fabricate an epitaxial layer according to the conventional manufacturing process, the present invention only use a standard well structure to achieve the low cost, high yield, and isolated transistor structure.

In order to make the aforementioned and other objectives, features, and advantages of the present invention comprehensible, embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 2:
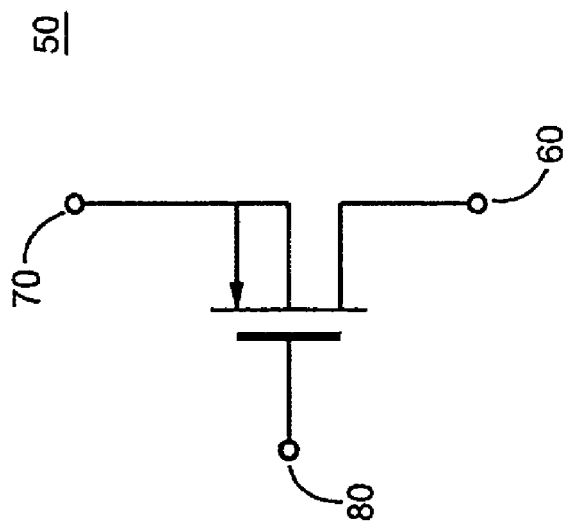
FIG. 2 is a schematic circuit diagram of a P-type MOSFET.
Figure 1:
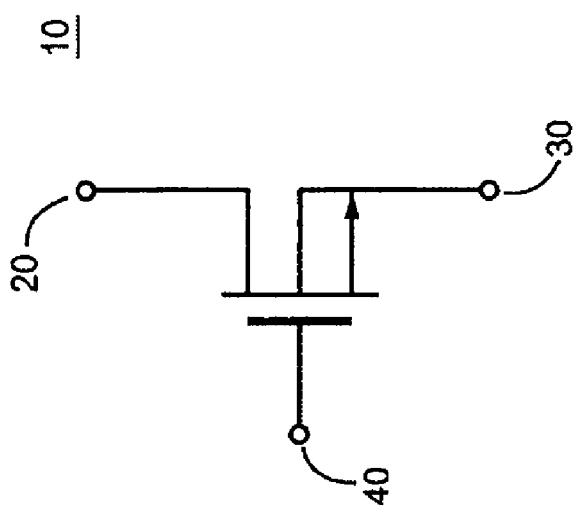
FIG. 1 is a schematic circuit diagram of an N-type MOSFET.
Figure 3:
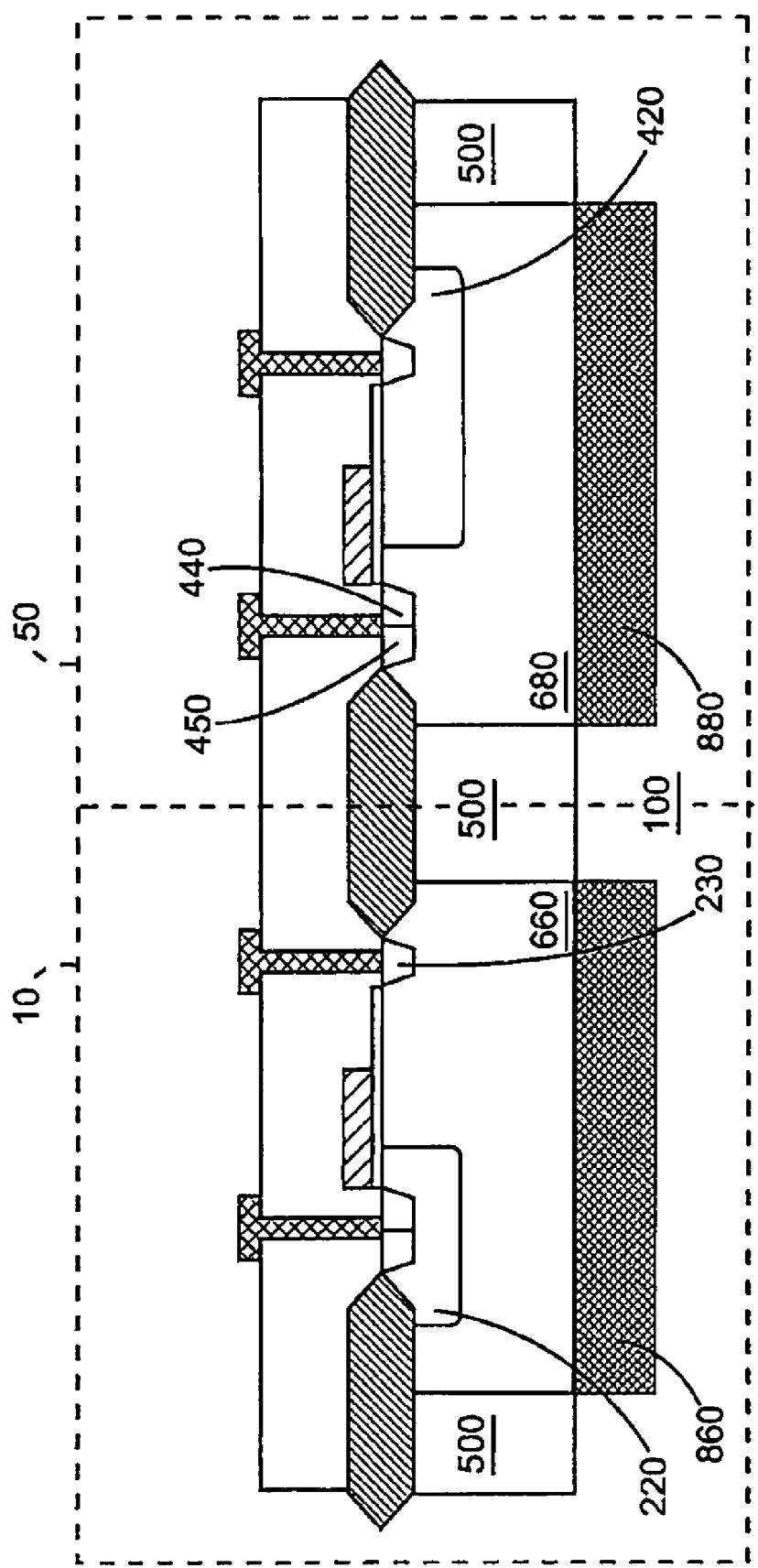
FIG. 3 is a structural cross-sectional view of a conventional MOSFET.
Figure 4:
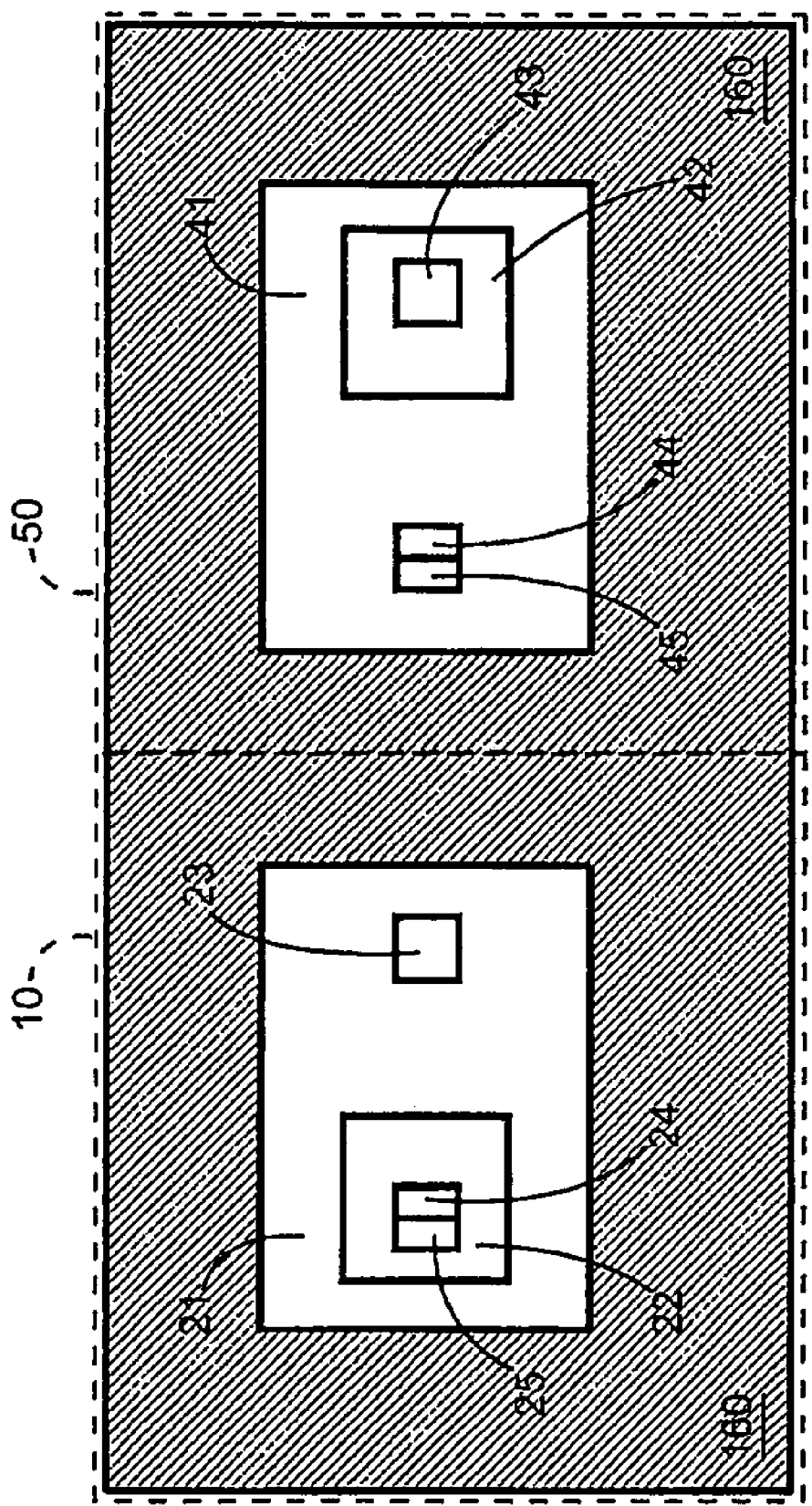
FIG. 4 is a partial schematic top view of a MOSFET of the present invention.
Figure 5:
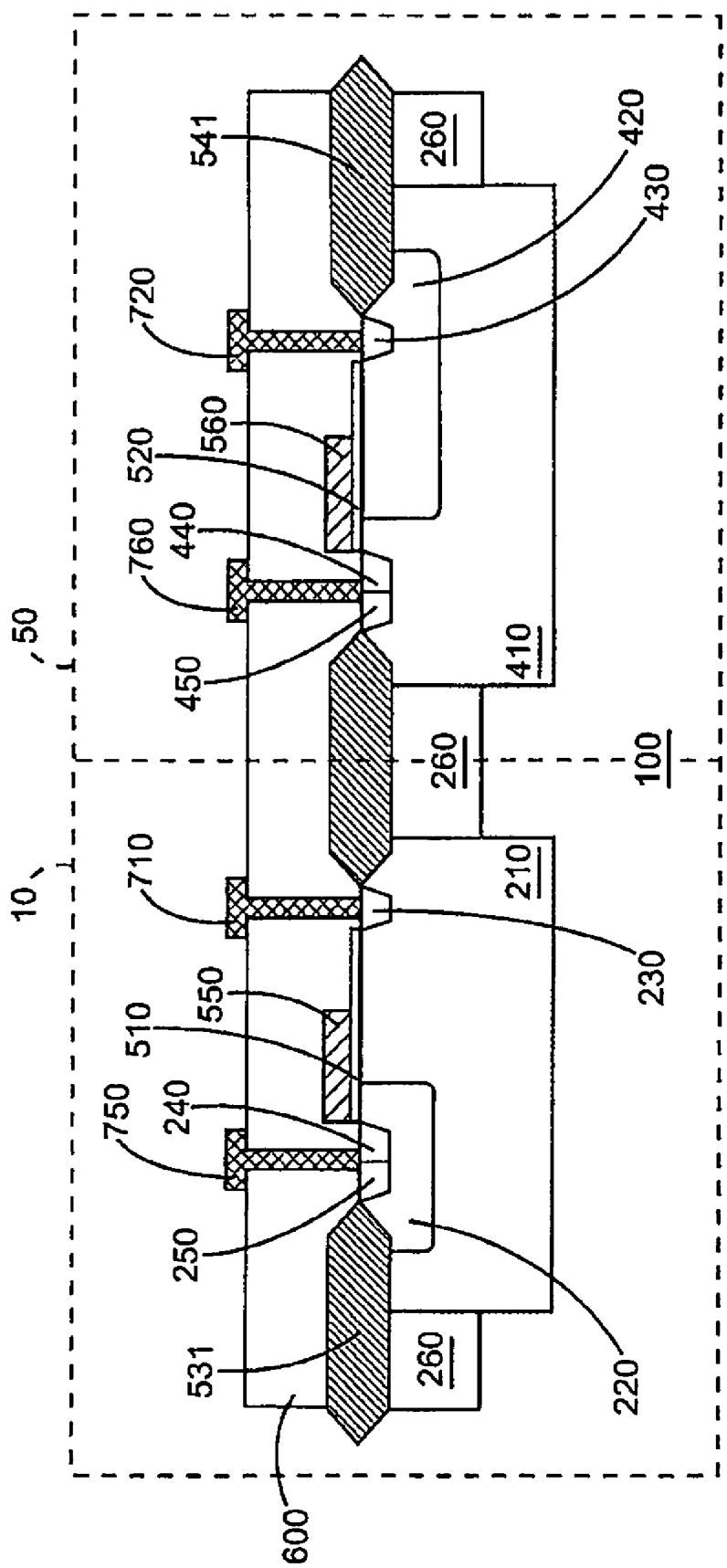
FIG. 5 is a schematic cross-sectional view of a structure of the MOSFET of the present invention.

Referring to FIGS. 4 and 5, a partial schematic top view and a schematic cross-sectional view of a structure of a MOSFET of the present invention are shown. As shown in the figures, a P-type MOSFET 50 of the present invention at least includes a P-type substrate 100; a first N-type diffusion region 41 having N conductivity-type ions, forming a first N-well 410 in the P-type substrate 100; a first P-type diffusion region 42 having P conductivity-type ions, forming a first P-type region 420 in the first N-well 410; a first drain diffusion region 43 having P+ conductivity-type ions, forming a first drain region 430 in the first P-type diffusion region 42; a first source diffusion region 44 having P+ conductivity-type ions, forming a first source region 440; a first channel formed between the first source region 440 and the first drain region 430; and a first contact diffusion region 45 having N+ conductivity-type ions, forming a first contact region 450. Wherein, the first N-type diffusion region 41 surrounds the first source region 440 and the first contact region 450. In addition, the P-type MOSFET 50 further includes a plurality of separated P-type diffusion regions 160, forming a plurality of separated P-type regions 260 in the P-type substrate 100, so as to provide isolation between FETs.

In addition, an N-type MOSFET 10 of the present invention also includes the P-type substrate 100; a second N-type diffusion region 21 having N conductivity-type ions, forming a second N-well 210 in the P-type substrate 100; a second P-type diffusion region 22 having P conductivity-type ions, forming a second P-type region 220 in the second N-well 210; a second drain diffusion region 23 having N+ conductivity-type ions, forming a second drain region 230 in the second N-type diffusion region 21; a second source diffusion region 24 having N+ conductivity-type ions, forming a second source region 240; a second channel formed between the second source region 240 and the second drain region 230; and a second contact diffusion region 25 having P+ conductivity-type ions, forming a second contact region 250. Wherein, the second P-type diffusion region 22 surrounds the second source region 240 and the second contact region 250. In addition, the N-type MOSFET 10 further includes a plurality of separated P-type diffusion regions 160 having P conductivity-type ions, forming a plurality of separated P-type regions 260 is formed in the P-type substrate 100, so as to provide isolation between FETs.

Furthermore, the first P-type region 220 and the second P-type region 420 may be formed through a P-well or P-type body/base fabricating processes. When the first P-type region 220 and the second P-type region 420 are the P-type body/base, the first N-well 410 and the second N-well 210 are the N-well. When the first P-type region 220 and the second P-type region 420 are the P-well, the first N-well 410 and the second N-well 210 are the deep N-well. As far as the concentration is concerned, the body/base is higher than the well, and the well is higher than the deep well.

In addition, a first thin gate oxide layer 520 and a second thin gate oxide layer 510, a first thick field oxide layer 541, a second thick field oxide layer 531 are formed on the P-type substrate 100. A first gate 560 is disposed on the first thin gate oxide layer 520, for controlling an amount of current in the first channel in the P-type MOSFET 50. A second gate 550 is disposed on the second thin gate oxide layer 510, for controlling an amount of current in the second channel of the N-type MOSFET 10. A silicon oxide insulating layer 600 covers the gates 550, 560 and the thick field oxide layers 531, 541. A first drain metal contact 720 and a second drain metal contact 710 having metal electrodes are connected with the first drain diffusion region 43 and the second drain diffusion region 23 respectively. A first source metal contact 760 having the metal electrode is connected with the first source diffusion region 44 and the first contact diffusion region 45. A second source metal contact 750 having the metal electrode is connected with the second source diffusion region 24 and the second contact diffusion region 25.

Moreover, the plurality of separated P-type diffusion regions 160 having P conductivity-type ions forms a plurality of separated P-type regions 260 in the P-type substrate 100, so as to provide isolation between FETs. The first P-type region 420, the second P-type region 220, the separated P-type region 260, the first N-well 410, and the second N-well 210 form depletion regions in regions of different polarities.

Figure 6:
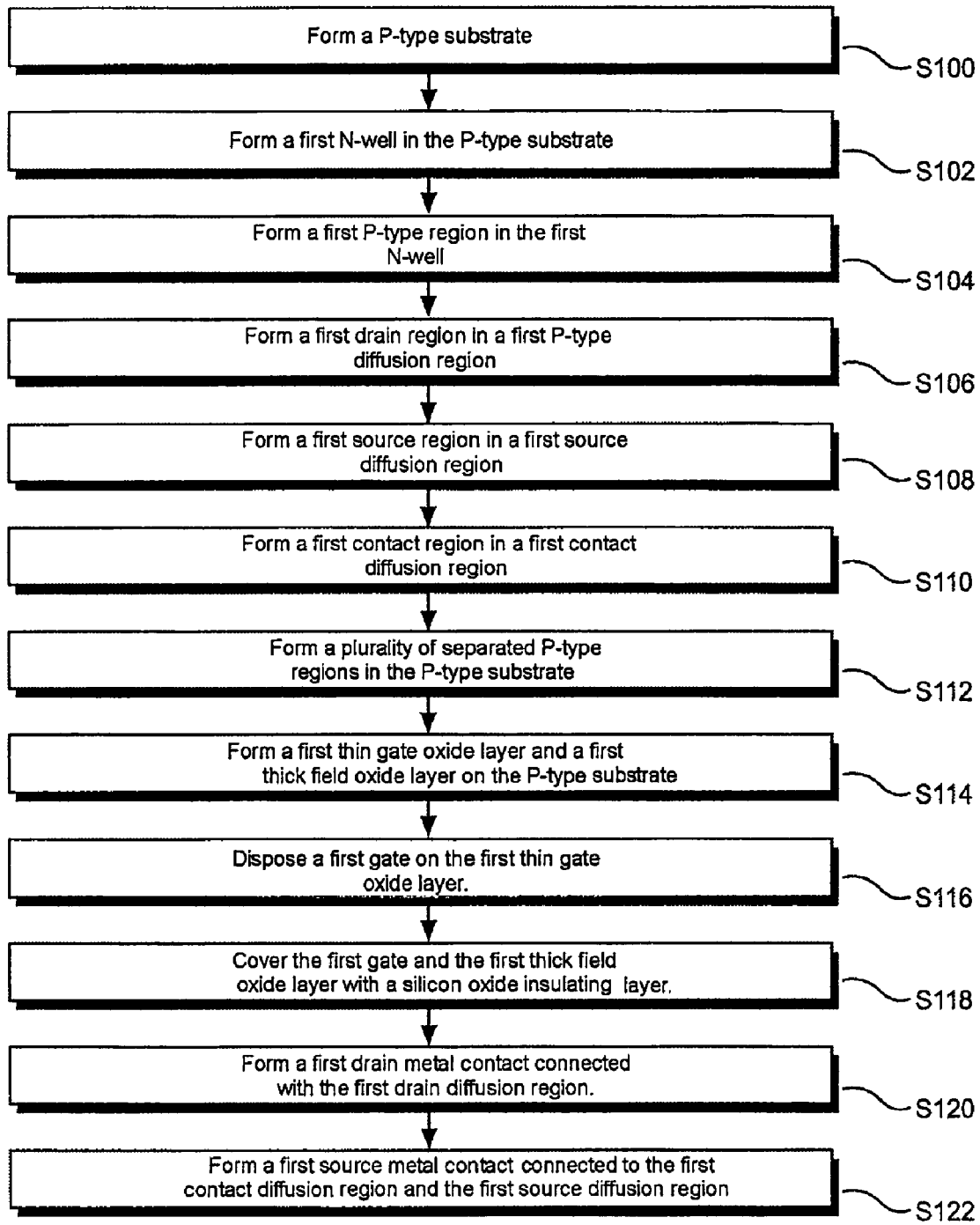
FIG. 6 is a flow chart of processes of a method of fabricating a P-type MOSFET of the present invention.

Referring to FIG. 6, a flow chart of processes of a method of fabricating the P-type MOSFET of the present invention is shown. As shown in the flow chart, the method of fabricating the P-type MOSFET is described as follows. First, a P-type substrate is formed (S100). Then, a first N-well is formed in the P-type substrate in a first N-type diffusion region having N conductivity-type ions (S102). Next, a first P-type region is formed in the first N-well in a first P-type diffusion region having P conductivity-type ions (S104). After that, a first drain region is formed in the first P-type diffusion region in a first drain diffusion region having P+ conductivity-type ions (S106). Thereafter, a first source region is formed in a first source diffusion region having P+ conductivity-type ions (S108), wherein a first channel is formed between the first source region and the first drain region. After that, a first contact region is formed in a first contact diffusion region having N+ conductivity-type ions (S110), wherein a first N-type diffusion region surrounds the first source region and the first contact region.

Next, a plurality of separated P-type regions is formed in the P-type substrate in a plurality of separated P-type diffusion regions having P conductivity-type ions, so as provide an isolation effect (S112). After that, a first thin gate oxide layer and a first thick field oxide layer is formed on the P-type substrate (S114). Then, a first gate is disposed on the first thin gate oxide layer, for controlling an amount of current in the first channel (S116). Thereafter, the first gate and the first thick field oxide layer are covered with a silicon oxide insulating layer (S118). After that, a first drain metal contact having a first metal electrode connected with the first drain diffusion region is formed (S120). Finally, a first source metal contact having a second metal electrode connected to the first contact diffusion region and the first source diffusion region is formed (S122).

Figure 7:
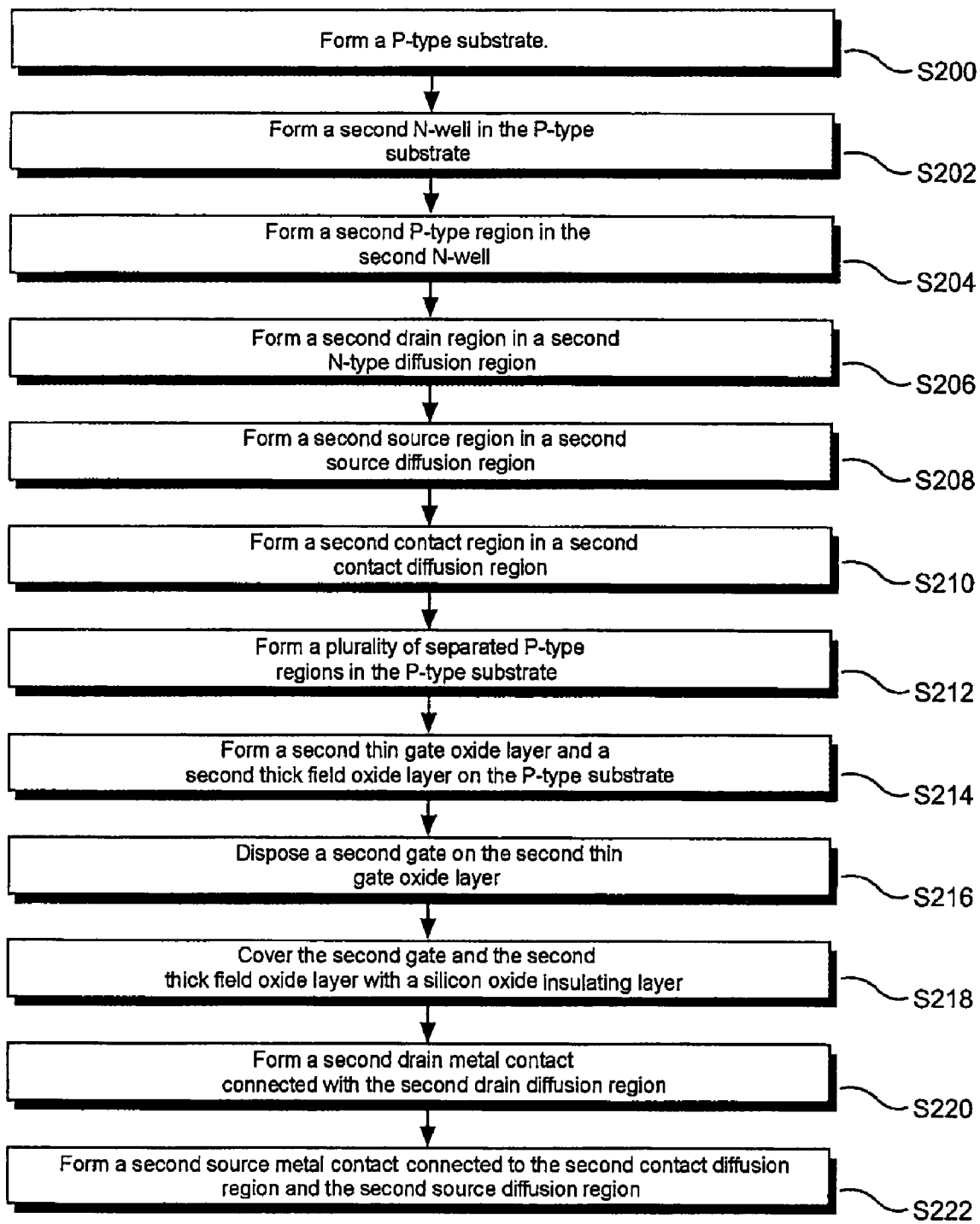
FIG. 7 is a flow chart of processes of a method of fabricating an N-type MOSFET of the present invention.

Referring to FIG. 7, a flow chart of processes of a method of fabricating the N-type MOSFET of the present invention is shown. As shown in the flow chart, the method of fabricating the N-type MOSFET is described as follows. First, a P-type substrate is formed (S200). Then, a second N-well is formed in the P-type substrate in a second N-type diffusion region having N conductivity-type ions (S202). Next, a second P-type region is formed in the second N-well in a second P-type diffusion region having P conductivity-type ions (S204). After that, a second drain region is formed in the second N-type diffusion region in a second drain diffusion region having N+ conductivity-type ions (S206). Thereafter, a second source region is formed in a second source diffusion region having N+ conductivity-type ions (S208), wherein a second channel is formed between the second source region and the second drain region. After that, a second contact region is formed in a second contact diffusion region having P+ conductivity-type ions (S210), wherein a second P-type region surrounds the second source region and the second contact region.

Next, a plurality of separated P-type regions is formed in the P-type substrate, so as to provide an isolation effect in a plurality of separated P-type diffusion regions having P conductivity-type ions (S212). After that, a second thin gate oxide layer and a second thick field oxide layer are formed on the P-type substrate (S214). Then, a second gate is disposed on the second thin gate oxide layer, for controlling an amount of current in the second channel (S216). Thereafter, the second gate and the second thick field oxide layer are covered with a silicon oxide insulating layer (S218). After that, a second drain metal contact having a third metal electrode connected with and the second drain diffusion region is formed (S220). Finally, a second source metal contact having a fourth metal electrode connected to the second contact diffusion region and the second source diffusion region is formed (S222).

In view of the above, the MOSFET device of the present invention, for example, the N-type MOSFET 10 and the P-type MOSFET 50, merely uses a simplified manufacturing process to realize a high breakdown voltage, low on-resistance, and the isolation structure. Furthermore, the conventional MOSFET isolation structure adopts an N-type epitaxial layer 660 to surround the second drain region 230 and the second P-type region 220 of the N-type MOSFET 10 and uses an N-type epitaxial layer 680 to surround the first source region 440, the first contact region 450, and the first P-type region 420 of the P-type MOSFET 50. However, the present invention uses the first N-well 410 and the second N-well 210 in conjunction with other structures to achieve the isolation effect. Therefore, instead of additional using masks to fabricate an epitaxial layer according to the conventional manufacturing process, the present invention only use a standard well structure to achieve the low cost, high yield, and isolated transistor structure.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A P-type metal oxide semiconductor field effect transistor (MOSFET), comprising:
a P-type substrate;
a first N-type diffusion region having N conductivity-type ions, forming a first N-well in the P-type substrate;
a first P-type diffusion region having P conductivity-type ions, forming a first P-type region in the first N-well;
a first drain diffusion region having P+ conductivity-type ions, forming a first drain region in the first P-type diffusion region;
a first source diffusion region having P+ conductivity-type ions, forming a first source region, wherein a first channel is formed between the first source region and the first drain region;
a first contact diffusion region having N+ conductivity-type ions, forming a first contact region, wherein the first N-type diffusion region surrounds the first source region and the first contact region;
a plurality of separated P-type diffusion regions having P conductivity-type ions, forming a plurality of separated P-type regions in the P-type substrate to provide an isolation effect;
a first thin gate oxide layer and a first thick field oxide layer, formed on the P-type substrate;
a first gate, disposed on the first thin gate oxide layer, for controlling an amount of current in the first channel;
a silicon oxide insulating layer, covering the first gate and the first thick field oxide layer;
a first drain metal contact, having a first metal electrode connected with the first drain diffusion region; and
a first source metal contact, having a second metal electrode connected to the first contact diffusion region and the first source diffusion region.

2. The P-type MOSFET as claimed in claim 1, wherein the first P-type region located in the first N-well is formed through a P-well manufacturing process.

3. The P-type MOSFET as claimed in claim 1, wherein the first P-type region located in the first N-well is formed through a P-type body/base manufacturing process.

4. An N-type MOSFET, comprising:
a P-type substrate;
a second N-type diffusion region having N conductivity-type ions, forming a second N-well in the P-type substrate;
a second P-type diffusion region having P conductivity-type ions, forming a second P-type region in the second N-well;
a second drain diffusion region having N+ conductivity-type ions, forming a second drain region in the second N-type diffusion region;
a second source diffusion region having N+ conductivity-type ions, forming a second source region, wherein a second channel is formed between the second source region and the second drain region;
a second contact diffusion region having P+ conductivity-type ions, forming a second contact region, wherein the second P-type region surrounds the second source region and the second contact region;
a plurality of separated P-type diffusion regions having P conductivity-type ions, forming a plurality of separated P-type regions in the P-type substrate to provide an isolation effect;
a second thin gate oxide layer and a second thick field oxide layer, formed on the P-type substrate;
a second gate, disposed on the second thin gate oxide layer, for controlling an amount of current in the second channel;
a silicon oxide insulating layer, covering the second gate and the second thick field oxide layer;
a second drain metal contact, having a third metal electrode connected with the second drain diffusion region; and
a second source metal contact, having a fourth metal electrode connected to the second contact diffusion region and the second source diffusion region.

5. The N-type MOSFET as claimed in claim 4, wherein the second P-type region located in the second N-well is formed is formed through a P-well manufacturing process.

6. The N-type MOSFET as claimed in claim 4, wherein the second P-type region located in the second N-well is formed is formed through a P-type body/base manufacturing process.

7. A method of fabricating a P-type MOSFET, comprising:
forming a P-type substrate;
forming a first N-well in the P-type substrate in a first N-type diffusion region having N conductivity-type ions;

forming a first P-type region in the first N-well in a first P-type diffusion region having P conductivity-type ions;

forming a first drain region in the first P-type diffusion region in a first drain diffusion region having P+ conductivity-type ions;

forming a first source region in a first source diffusion region having P+ conductivity-type ions, wherein a first channel is formed between the first source region and the first drain region;

forming a first contact region in a first contact diffusion region having N+ conductivity-type ions, wherein the first N-type diffusion region surrounds the first source region and the first contact region;

forming a plurality of separated P-type regions in the P-type substrate in a plurality of separated P-type diffusion regions having P conductivity-type ions, so as to provide an isolation effect;

forming a first thin gate oxide layer and a first thick field oxide layer on the P-type substrate;

disposing a first gate on the first thin gate oxide layer, for controlling an amount of current in the first channel;

covering the first gate and the first thick field oxide layer with a silicon oxide insulating layer;

forming a first drain metal contact having a first metal electrode connected with the first drain diffusion region; and forming a first source metal contact having a second metal electrode connected to the first contact diffusion region and the first source diffusion region.

8. The method of fabricating a P-type MOSFET as claimed in claim 7, wherein the first P-type region located in the first N-well is formed through a P-well manufacturing process.

9. The method of fabricating a P-type MOSFET as claimed in claim 7, wherein the first P-type region located in the first N-well is formed through a P-type body/base manufacturing process.

10. A method of fabricating an N-type MOSFET, comprising:

forming a P-type substrate;

forming a second N-well in the P-type substrate in a second N-type diffusion region having N conductivity-type ions;

forming a second P-type region in the second N-well in a second P-type diffusion region having P conductivity-type ions;

forming a second drain region in the second N-type diffusion region in a second drain diffusion region having N+ conductivity-type ions;

forming a second source region in a second source diffusion region having N+ conductivity-type ions, wherein a second channel is formed between the second source region and the second drain region;

forming a second contact region in a second contact diffusion region having P+ conductivity-type ions, wherein the second P-type region surrounds the second source region and the second contact region;

forming a plurality of separated P-type regions in the P-type substrate in a plurality of separated P-type diffusion regions having P conductivity-type ions, so as to provide an isolation effect;

forming a second thin gate oxide layer and a second thick field oxide layer on the P-type substrate;

disposing a second gate on the second thin gate oxide layer, for controlling an amount of current in the second channel;

covering the second gate and the second thick field oxide layer with a silicon oxide insulating layer;

forming a second drain metal contact having a third metal electrode connected with the second drain diffusion region; and forming a second source metal contact having a fourth metal electrode connected to the second contact diffusion region and the second source diffusion region.

11. The method of fabricating an N-type MOSFET as claimed in claim 10, wherein the second P-type region located in the second N-well is formed through a P-well manufacturing process.

12. The method of fabricating an N-type MOSFET as claimed in claim 10, wherein the second P-type region located in the second N-well is formed through a P-type body/base manufacturing process.

\* \* \* \* \*